United States Patent
Iwasaki et al.

(10) Patent No.: US 8,663,432 B2
(45) Date of Patent: Mar. 4, 2014

(54) MAGNETRON SPUTTERING APPARATUS AND MAGNETRON SPUTTERING METHOD

(75) Inventors: Masaaki Iwasaki, Tokyo (JP);
Yoshifumi Oda, Kanagawa-ken (JP);
Takehiro Sato, Kanagawa-ken (JP)

(73) Assignees: Shibaura Mechatronics Corporation, Yokohama-Shi (JP); Sony DADC Corporation, Tokyo (JP)

(*) Notice: Subject to any disclaimer, the term of this patent is extended or adjusted under 35 U.S.C. 154(b) by 102 days.

(21) Appl. No.: 12/867,354

(22) PCT Filed: Feb. 6, 2009

(86) PCT No.: PCT/JP2009/052100
§ 371 (c)(1),
(2), (4) Date: Dec. 21, 2010

(87) PCT Pub. No.: WO2009/101909
PCT Pub. Date: Aug. 20, 2009

(65) Prior Publication Data
US 2011/0114473 A1     May 19, 2011

(30) Foreign Application Priority Data
Feb. 13, 2008   (JP) ................................. 2008-032127

(51) Int. Cl.
*C23C 14/35* (2006.01)

(52) U.S. Cl.
USPC ............ 204/192.13; 204/298.03; 204/298.07; 204/298.2

(58) Field of Classification Search
USPC ................ 204/192.13, 298.03, 298.2, 298.07
See application file for complete search history.

(56) References Cited

U.S. PATENT DOCUMENTS

| | | | | |
|---|---|---|---|---|
| 5,907,220 A | * | 5/1999 | Tepman et al. | 315/111.41 |
| 6,013,159 A | * | 1/2000 | Adams et al. | 204/192.12 |
| 7,018,515 B2 | * | 3/2006 | Gung et al. | 204/192.12 |
| 2009/0139854 A1 | * | 6/2009 | Chang et al. | 204/192.13 |

FOREIGN PATENT DOCUMENTS

| | | |
|---|---|---|
| JP | 05-179426 A | 7/1993 |
| JP | 05-311425 A | 11/1993 |
| JP | 10-060640 A | 3/1998 |
| JP | 11-006062 A | 1/1999 |
| JP | 11-144338 A | 5/1999 |
| JP | 2001-240964 A | 9/2001 |
| JP | 2005-508447 A | 3/2005 |
| WO | 03/040428 A1 | 5/2003 |

OTHER PUBLICATIONS

International Search Report PCT/JP2009/052100 dated Apr. 14, 2009.
Chinese Office action for 200980105049.0 dated Nov. 23, 2011.

* cited by examiner

*Primary Examiner* — Rodney McDonald
(74) *Attorney, Agent, or Firm* — Pearne & Gordon LLP (57) ABSTRACT

A magnetron sputtering apparatus of the invention includes: a sputtering chamber in which a target can be opposed to an object to be subjected to film formation; a gas introduction port facing the sputtering chamber; a magnet provided outside the sputtering chamber and opposite to the target and being rotatable about a rotation center which is eccentric with respect to center of the magnet; a sensor configured to detect a circumferential position of the magnet in a plane of rotation of the magnet; and a controller configured to start voltage application to the target to cause electrical discharge in the sputtering chamber on the basis of the circumferential position of the rotating magnet and gas pressure distribution in the sputtering chamber.

8 Claims, 5 Drawing Sheets

COMPARATIVE EXAMPLE

FIG. 5A
MAGNET POSITION SENSOR

FIG. 5B
SUBSTRATE

FIG. 5C
TARGET VOLTAGE APPLICATION COMMAND

MAGNETRON SPUTTERING APPARATUS AND MAGNETRON SPUTTERING METHOD

TECHNICAL FIELD

The invention relates to a magnetron sputtering apparatus and a magnetron sputtering method.

BACKGROUND ART

Conventionally, film formation of a recording layer, reflective film and the like on the resin substrate of a disc-shaped recording medium, for instance, has been performed by sputtering film formation.
[Patent Citation 1]
JP-A 5-311425 (1993)
[Patent Citation 2]
JP-A 5-179426 (1993)
[Patent Citation 3]
JP-A 11-144338 (1999)

DISCLOSURE OF INVENTION

Technical Problem

In previous optical discs, because the allowable range of reflectance variation is relatively wide, there is no problem with the variation of film thickness of a reflective film, which affects the reflectance. However, in particular, the semi-transparent film for multilayer purposes, such as two-layer purposes, requires circumferential uniformity. Because information on reflection is read through that semi-transparent film, variation in the semi-transparent film affects the reflection film as a larger variation. Thus, in such multilayering, and high-density, high-capacity optical discs in the next generation, the allowable range of reflectance variation is narrowed. Hence, if the current variation of film thickness is left unchanged, there is concern about the problem of quality degradation, such as decrease in the process capability index, which guarantees the quality at production time.

Currently, in film formation of optical discs, relatively stable results are achieved in the radial distribution of film thickness, but the circumferential distribution of film thickness has a relatively large variation. Hence, to suppress the film thickness variation throughout the disc surface, it is effective to suppress the film thickness variation particularly in the circumferential direction.

Here, to achieve circumferential uniformity in film thickness, it may be contemplated to introduce gas uniformly from a plurality of locations in the circumferential direction of the processing chamber as disclosed in Patent Documents 1 and 2. However, this complicates the structure of the apparatus, and the currently existing apparatus cannot be directly used.

Furthermore, Patent Document 3 discloses a magnetron sputtering apparatus in which the film thickness on the substrate is made uniform by controlling the number of revolutions of the magnet in the time period required for one time of thin film formation. However, the plasma distribution in the film formation chamber affecting the film thickness distribution depends also on the position of the gas introduction port, for instance, besides the number of revolutions of the magnet. Hence, simply controlling the number of revolutions of the magnet is insufficient for application to, in particular, sputtering film formation of next-generation optical discs, which require a demanding quality of film thickness in the future.

The invention has been made in view of the aforementioned problems, and provides a magnetron sputtering apparatus and a magnetron sputtering method for improving the circumferential uniformity of film thickness.

Technical Solution

According to an aspect of the invention, there is provided a magnetron sputtering apparatus including: a sputtering chamber in which a target can be opposed to an object to be subjected to film formation; a gas introduction port facing the sputtering chamber; a magnet provided outside the sputtering chamber and opposite to the target and being rotatable about a rotation center which is eccentric with respect to center of the magnet; a sensor configured to detect a circumferential position of the magnet in a plane of rotation of the magnet; and a controller configured to start voltage application to the target to cause electrical discharge in the sputtering chamber on the basis of the circumferential position of the rotating magnet and gas pressure distribution in the sputtering chamber.

According to another aspect of the invention, a magnetron sputtering method including: opposing a target to an object to be subjected to film formation in a sputtering chamber; introducing a sputtering gas into the sputtering chamber from a gas introduction port facing the sputtering chamber, and rotating a magnet about a rotation center which is eccentric with respect to center of the magnet, the magnet being provided outside the sputtering chamber and opposite to the target; and starting voltage application to the target to cause electrical discharge in the sputtering chamber on the basis of a circumferential position of the rotating magnet in a plane of rotation of the magnet and gas pressure distribution in the sputtering chamber.

| [Explanation of Reference] | |
|---|---|
| 10 | substrate |
| 13 | sputtering chamber |
| 15 | target |
| 16 | magnet |
| 45 | gas introducing port |
| 51 | power supply |
| 53 | sensor |
| 55 | controller |

BEST MODE FOR CARRYING OUT THE INVENTION

Embodiments of the invention will now be described with reference to the drawings.

Figure 1:
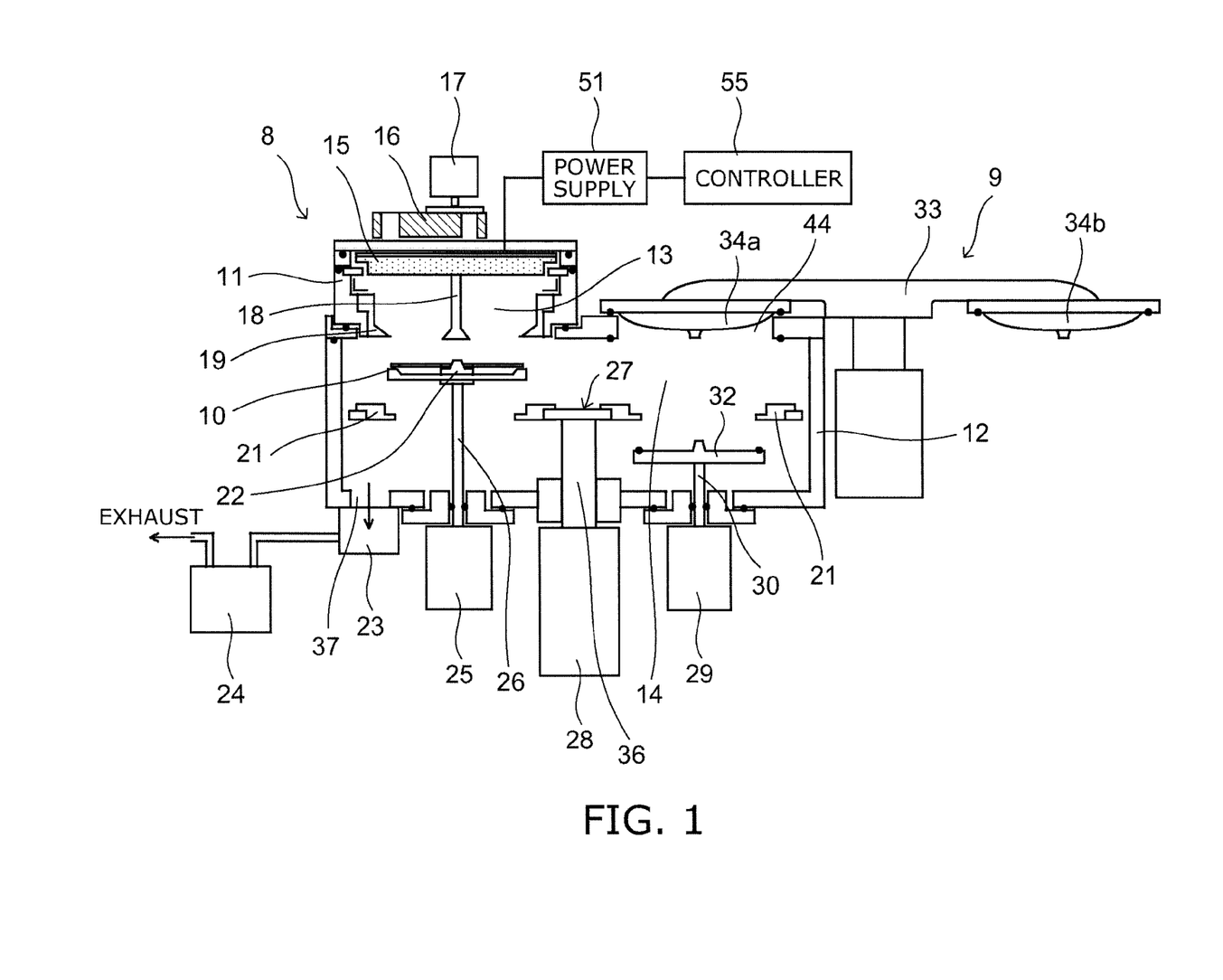
FIG. 1 is a schematic view showing the general configuration of a magnetron sputtering apparatus according to an embodiment of the invention.
Figure 2:
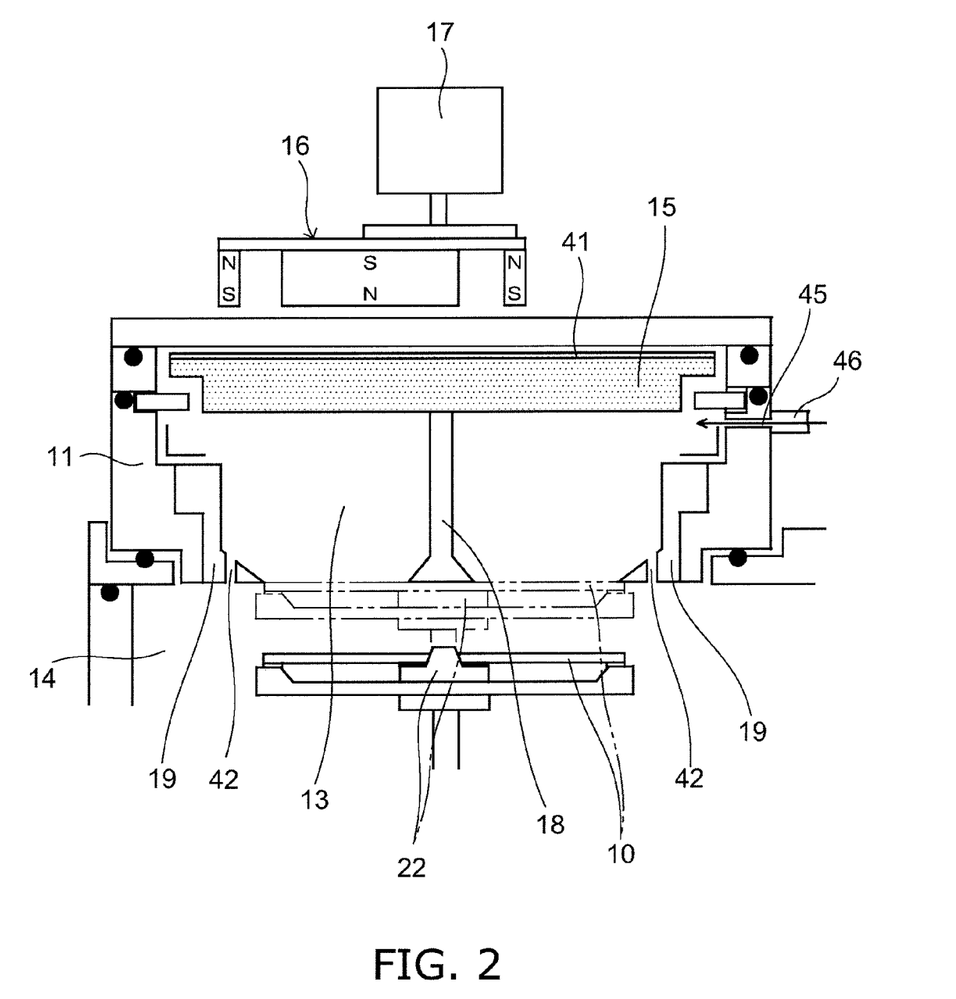
FIG. 2 is an enlarged view of the relevant part in FIG. 1.

FIG. 1 is a schematic view showing the general configuration of a magnetron sputtering apparatus according to an embodiment of the invention. FIG. 2 is an enlarged view of its relevant part.

This apparatus is a magnetron sputtering apparatus for performing sputtering film formation in a single-wafer process on an object to be subjected to film formation, such as a substrate 10 of a disc-shaped recording medium, and primarily includes an apparatus body 8 including a sputtering source, a transfer mechanism and the like, an external transfer mechanism 9 for carrying the substrate 10 into/out of the apparatus body 8, and a power supply 51, a controller 55 and the like provided outside the apparatus body 8.

The apparatus body 8 includes a generally cylindrical hermetic container 11, and a generally cylindrical hermetic container 12 having a larger diameter than the hermetic container 11. The inside of the hermetic container 11 functions as a sputtering chamber 13, and the inside of the hermetic container 12 functions as a transfer chamber 14.

An exhaust port 37 is formed at the bottom of the hermetic container 12, and a vacuum exhaust system including vacuum pumps 23, 24 and the like is connected to this exhaust port 37. By evacuating the inside of the hermetic containers 12, 11 through the exhaust port 37, a desired reduced-pressure atmosphere is maintained in the hermetic containers 12, 11.

The sputtering chamber 13 is located eccentrically above the transfer chamber 14. A target 15 is held at the top of the sputtering chamber 13 via a backing plate 41 (shown in FIG. 2) and the like. A center mask 18 extends downward from the central portion of the target 15. An outer mask 19 is provided in the outer peripheral portion in the sputtering chamber 13.

When sputtering film formation on a substrate 10 is not performed, the bottom of the sputtering chamber 13 is in communication with the transfer chamber 14. However, at the time of sputtering film formation, a substrate 10 is set at the position indicated by the double-dot-dashed line in FIG. 2, and is opposed to the target 15. In that state, the bottom of the sputtering chamber 13 is closed by the substrate 10. Furthermore, the center mask 18 covers the center portion, including the center hole, of the disc-shaped substrate 10 having a center hole, and the inner peripheral edge of the outer mask 19 covers the outermost peripheral edge of the substrate 10. The portions of the substrate 10 covered with those masks 18, 19 are not subjected to film formation. Furthermore, at the time of sputtering film formation, the gas in the sputtering chamber 13 can be exhausted through an exhaust hole 42 formed in the outer mask 19 to the transfer chamber 14, and further to the exhaust port 37.

Gas introduction into the sputtering chamber 13 is performed through one location in its circumferential direction. As shown in FIG. 2, a gas introduction port 45 is opened in the peripheral wall of the hermetic container 11 surrounding the sputtering chamber 13 and faces the inside of the sputtering chamber 13. To the gas introduction port 45 is connected a gas introduction pipe 46, and the gas introduction pipe 46 is connected to a gas supply source, not shown.

Above the sputtering chamber 13 and outside the hermetic container 11, a magnet 16 is opposed to the target 15. While being opposed to the target 15, the magnet 16 can be rotated by a motor 17.

Figure 3:
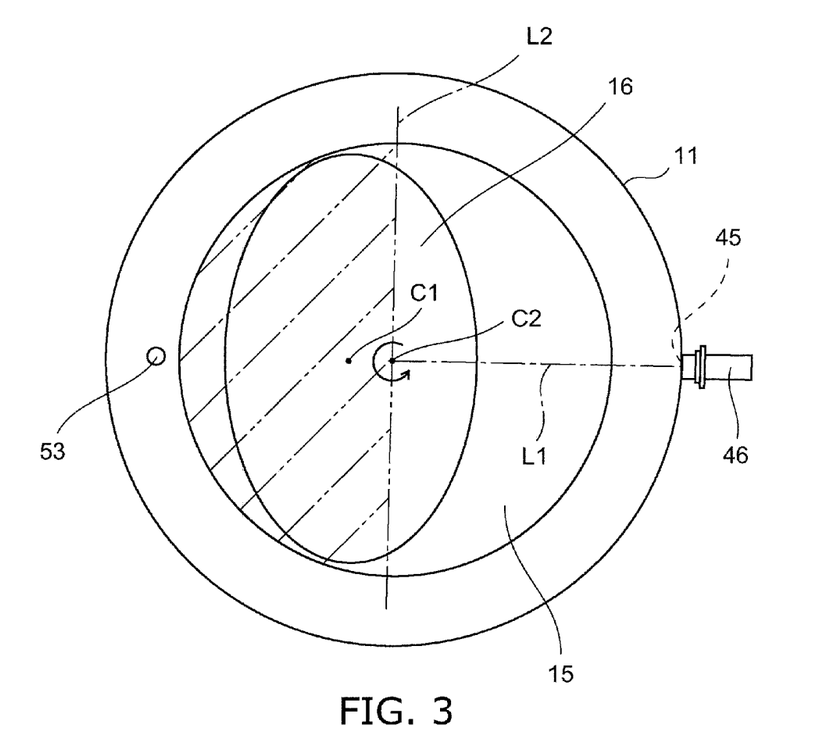
FIG. 3 is a schematic view showing the planar layout of the magnet, the target, and the gas introduction port in the magnetron sputtering apparatus.

FIG. 3 is a schematic view showing the planar layout of the magnet 16, the target 15, and the gas introduction port 45.

The planar shape of the target 15 is formed like a generally circular shape, and the planar shape of the magnet 16 is formed like an elliptical shape. The center (barycenter) C1 of the magnet 16 is located eccentrically with respect to the center of the target 15, and the magnet 16 rotates about the rotation center C2 located eccentrically with respect to its own center C1. It is noted that the planar shape of the magnet 16 is not limited to the elliptical shape, but may be shaped like a circle, triangle, heart and the like.

A to-be-detected object, not shown, rotated with the rotation of the magnet 16 is attached to the magnet 16. Detection of the to-be-detected object by a sensor 53 provided as a stationary object enables detection of the circumferential position of the magnet 16 in the plane of rotation.

Referring again to FIG. 1, a rotary shaft 36 extending vertically through the bottom wall is provided at the center of the transfer chamber 14. This rotary shaft 36 is coupled to a motor 28 provided outside the transfer chamber 14. A rotary table 27 is coupled to the upper end portion of the rotary shaft 36. A plurality of ring-shaped susceptors 21 are provided on the rotary table 27.

Actuators 25, 29 located across the rotary shaft 36 are provided below the bottom wall of the transfer chamber 14. The actuators 25, 29 are illustratively air cylinder devices, each including a rod 26, 30 vertically reciprocated in the transfer chamber 14 through the bottom wall of the transfer chamber 14. One actuator 25 is located below the sputtering chamber 13, and the other actuator 29 is located below a load lock opening 44. The load lock opening 44 is formed at a position in the upper wall of the transfer chamber 14 on the opposite side of the sputtering chamber 13 across the center of the transfer chamber 14. The load lock opening 44 can be hermetically closed by one of vacuum lids 34a, 34b fixed to both ends of a horizontal arm 33 of the external transfer mechanism 9.

A power supply 51 and a controller 55 are provided outside the apparatus body 8. The power supply 51 is illustratively a DC power supply and applies a DC voltage to the target 15. The operation of the power supply 51 is controlled by the controller 55 as described later.

Next, a sputtering film formation process using the aforementioned magnetron sputtering apparatus according to this embodiment is described.

A substrate 10 is carried into the transfer chamber 14 by the external transfer mechanism 9. It is noted that at the time of carrying-in/out of the substrate 10 and during the sputtering film formation process, the reduced-pressure state of the transfer chamber 14 and the sputtering chamber 13 is maintained.

By the operation at the time of carrying-out described later, the rod 30 of the actuator 29 is raised in the transfer chamber 14, and the susceptor 21 is lifted by a pusher 32 attached to the tip portion of the rod 30 and is in close contact with the lower edge of the load lock opening 44. In that state, one of the vacuum lids 34a, 34b of the horizontal arm 33, with a substrate 10 held on its lower surface illustratively by a mechanical chuck mechanism, is moved to above the load lock opening 44 and hermetically closes the load lock opening 44. The closed state of the load lock opening 44 by the vacuum lid 34a, 34b is maintained until the substrate 10 completed with the film formation process is carried to the outside.

Then, when the inside of the load lock opening 44 is exhausted and turned into the state of a reduced pressure comparable to the pressure in the transfer chamber 14, the rod 30 descends, and the substrate 10 moved from one of the vacuum lids 34a, 34b to the susceptor 21 descends with the susceptor 21. Then, the susceptor 21 with the substrate 10 mounted thereon is fitted and supported in a circular opening formed in the rotary table 27.

Next, the rotary shaft 36 is rotated by the motor 28, and thereby the rotary table 27 is rotated in the horizontal plane. Thus, the susceptor 21 located opposite to the load lock opening 44 and the substrate 10 held thereon are moved to the position below the sputtering chamber 13.

Then, the rod 26 of the actuator 25 is raised, and the protrusion provided at the central of the upper surface of the pusher 22 is fitted in the circular center hole of the substrate 10. Thus, the substrate 10 is supported generally horizontally and lifted from the susceptor 21 while being centered on the pusher 22. Then, by a further rise of the rod 26, as indicated by the double-dot-dashed line in FIG. 2, the film formation surface of the substrate 10 faces the sputtering chamber 13 while being opposed to the target 15.

Before the substrate 10 is carried into the sputtering chamber 13, argon gas, for instance, has been introduced into the sputtering chamber 13 through the gas introduction pipe 46 and the gas introduction port 45, and the magnet 16 has been in the rotating state. After the substrate 10 is carried therein (after being set at the position of the double-dot-dashed line in FIG. 2), a voltage is applied from the power supply 51 to the target 15. By this voltage application, electrical discharge occurs with the target 15 serving as a cathode and the inner wall surface of the sputtering chamber 13 serving as an anode. The introduced sputtering gas is ionized to generate a plasma in the sputtering chamber 13, and the target 15 is sputtered by accelerated argon ions, for instance.

Constituent atoms of the sputtered target 15 are attached and deposited on the portion of the film formation surface of the substrate 10 not covered with the center mask 18 and the outer mask 19, and a film of the target material is formed on the film formation surface.

This embodiment is based on magnetron sputtering. The magnetic field generated by the magnet 16 forms a magnetic field tunnel at the surface of the target 15, and electrons in the sputtering chamber 13 undergo revolving motion in that magnetic field tunnel. This can confine the plasma near the target 15 to increase the sputtering rate, and can separate the plasma from the substrate 10 to prevent plasma damage to the substrate 10.

When the film formation process described above is completed, the rod 26 is lowered, and the substrate 10 is returned onto the susceptor 21. Next, the rotary table 27 is rotated, and the substrate 10 completed with the film formation process is rotationally moved to the position opposed to the load lock opening 44.

Then, the rod 30 is raised, and the susceptor 21 with the substrate 10 mounted thereon is lifted by the pusher 32 and brought into close contact with the lower edge of the load lock opening 44, and the substrate 10 is moved to the lower surface of one of the vacuum lids 34a, 34b closing the load lock opening 44.

Then, after the inside of the load lock opening 44 is opened to the ambient air, the one of the vacuum lids 34a, 34b closing the load lock opening 44 rises while holding the film-formed substrate 10, and is separated from the load lock opening 44. Subsequently, the horizontal arm 33 is rotated in the horizontal plane while holding the processed substrate 10 on the lower surface of the one of the vacuum lids 34a, 34b and holding a substrate 10 before the film formation process on the lower surface of the other.

Thus, the film-formed substrate 10 is carried out of the transfer chamber 14, and a new to-be-processed substrate 10 before the film formation process is moved to the position facing the load lock opening 44. The substrate 10 before the film formation process, which has been moved to the position facing the load lock opening 44, is subjected to the operation and process similar to those described above. The foregoing is repeated so that substrates 10 are successively subjected to the film formation process on a wafer-by-wafer basis.

Figure 4A:
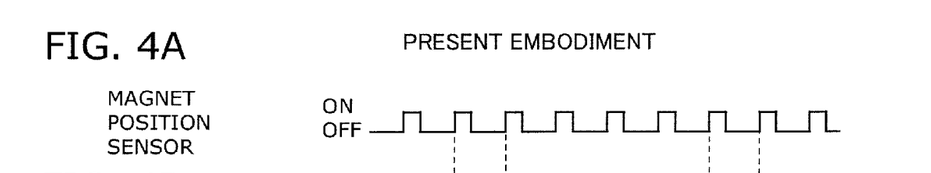
FIG. 4 is a timing chart showing the start/end of voltage application to the target in the embodiment of the invention.
Figure 4B:
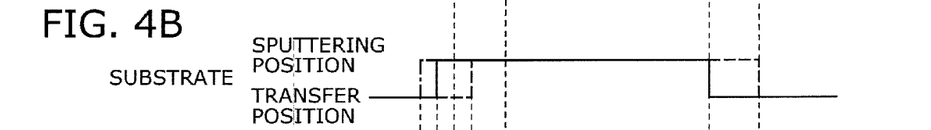
Figure 4C:
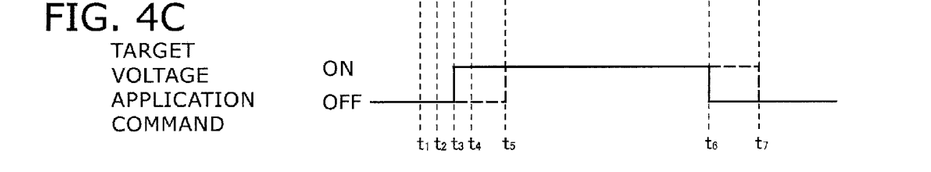

Here, in this embodiment, as in the timing chart shown in FIG. 4, the timing of voltage application to the target 15 and the end timing are controlled on the basis of where the circumferential position of the rotating magnet 16 in the plane of rotation is located with respect to the position of the gas introduction port 45.

In FIG. 4, (a) shows the output signal of the sensor 53 for detecting the circumferential position of the magnet 16 in the plane of rotation. When the sensor 53 detects the aforementioned to-be-detected object attached to the magnet 16, the sensor output is turned on. For instance, for convenience of description, in plan view shown in FIG. 3, when the center C1 and the rotation center C2 of the magnet 16 and the position of the gas introduction port 45 are aligned on a line so that the magnet 16 is located at the position (hereinafter also simply referred to as "opposed position") where the center (barycenter) C1 of the magnet 16 is opposed to the gas introduction port 45 across the rotation center C2, the sensor 53 is assumed to detect the to-be-detected object and turn on its output signal.

With the rotation of the magnet 16, each time the to-be-detected object passes through the sensor attachment position, the sensor output is turned on. By detection of the sensor output alternately repeating ON and OFF, it can be determined that the magnet 16 is normally rotating.

In FIG. 4, (b) shows whether the substrate 10 is located at the sputtering position (the position indicated by the double-dot-dashed line in FIG. 2) or the transfer position.

In FIG. 4, (c) shows the voltage application command which the controller 55 gives to the power supply 51. When the power supply 51 receives an ON command from the controller 55, a voltage is applied from the power supply 51 to the target 15, causing electrical discharge and generating a plasma in the sputtering chamber 13. When the power supply 51 receives an OFF command from the controller 55, voltage application to the target 15 is stopped, and the electrical discharge and plasma generation in the sputtering chamber 13 are stopped.

Figure 5A:
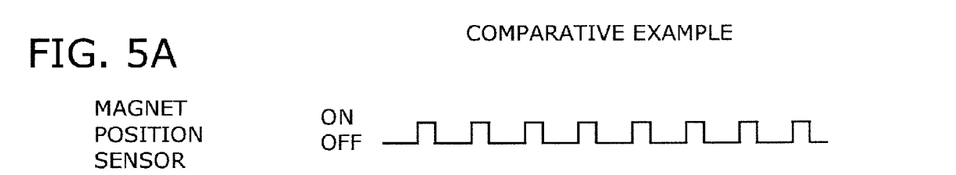
FIG. 5 is a timing chart showing the start/end of voltage application to the target in a comparative example.
Figure 5B:
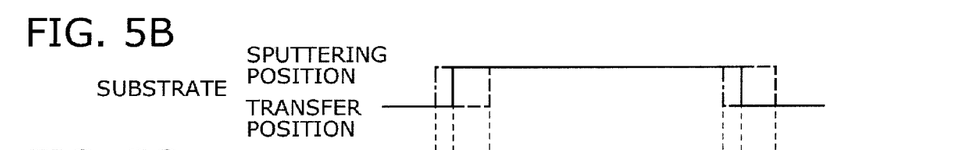
Figure 5C:
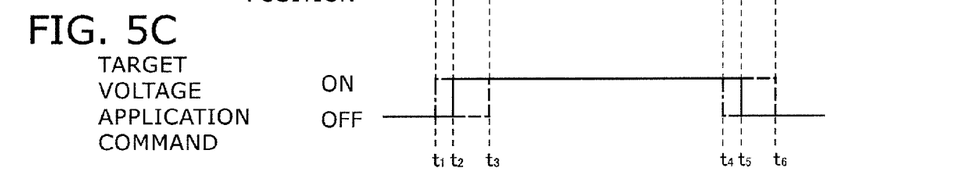

Here, FIG. 5 is a timing chart corresponding to FIG. 4 in a comparative example.

During the operation of the apparatus, when the substrate 10 is located at the transfer position, let alone at the sputtering position, the gas continues to be introduced into the sputtering chamber 13, and the magnet 16 continues to rotate.

In the comparative example, as in the timing chart indicated by the solid line in FIG. 5, at time t2, voltage application to the target 15 is started at the same time as the substrate 10 is set at the sputtering position. After sputtering film formation is performed for a predetermined time, at time t5, simultaneously with the separation of the substrate 10 from the sputtering position, voltage application to the target 15 is also ended.

In this comparative example, the timing of starting and ending voltage application to the target 15 is not synchronized with the circumferential position of the magnet 16 in the plane of rotation. When the substrate 10 is set at the sputtering position, voltage application to the target 15 is started. After a predetermined sputtering time has elapsed, when sputtering film formation is ended, voltage application to the target 15 is stopped, and the substrate 10 is separated from the sputtering position.

That is, as indicated by the dot-dashed line in FIG. 5, if the substrate 10 is set at the sputtering position at time t1, then voltage application to the target 15 is started at time t1. If the substrate 10 is separated from the sputtering position at time t4, then voltage application to the target 15 is ended at time t4.

Similarly, as indicated by the dashed line, if the substrate 10 is set at the sputtering position at time t3, then voltage application to the target 15 is started at time t3. If the substrate 10 is separated from the sputtering position at time t6, then voltage application to the target 15 is ended at time t6.

In the comparative example, the sensor 53 is used simply for the purpose of detecting whether the magnet 16 is normally rotating.

In contrast, in this embodiment, the start/end of voltage application to the target 15 is controlled on the basis of where the circumferential position of the rotating magnet 16 in the plane of rotation is located relative to the gas introduction port 45 in plan view shown in FIG. 3.

Specifically, with the substrate 10 set at the sputtering position, voltage application to the target 15 is started when the sensor 53 is turned on, that is, when the magnet 16 is located at the "opposed position" with respect to the gas introduction port 45, described above with reference to FIG. 3.

In FIG. 4, even if the substrate 10 is set at the sputtering position as indicated by the solid line at time t2, for instance, the sensor output is OFF at that time t2, and the magnet 16 is not located at the aforementioned "opposed position". Hence, voltage application to the target 15 is not started. Voltage application to the target 15 is started only after time t3 has come when the sensor output is first turned on after time t2.

Similarly, even if the substrate 10 is set at the sputtering position as indicated by the dot-dashed line at time t1, for instance, the sensor output is just switched from ON to OFF at that time t1, and the magnet 16 is not located at the aforementioned "opposed position". Hence, voltage application to the target 15 is not started. Voltage application to the target 15 is started only after time t3 has come when the sensor output is first turned on after time t1.

Furthermore, even if the substrate 10 is set at the sputtering position as indicated by the dashed line at time t4 after time t3, the sensor output is just switched from ON to OFF at that time t4, and the magnet 16 is not located at the aforementioned "opposed position". Hence, voltage application to the target 15 is not started. Voltage application to the target 15 is started only after time t5 has come when the sensor output is first turned on after that time t4.

Voltage application to the target 15 is continued for a predetermined time. This voltage application time is determined in view of rotating the magnet 16 an integer number of times on the basis of the relationship between the setting of the number of revolutions per unit time of the magnet 16 and the sputtering time setting. In the example shown in FIG. 4, in the case where voltage application to the target 15 is started at time t3, voltage application to the target 15 is ended at time t6 when the magnet 16 has rotated five times therefrom. Similarly, in the case where voltage application to the target 15 is started at time t5, voltage application to the target 15 is ended at time t7 when the magnet 16 has rotated five times therefrom.

Thus, the timing of stopping voltage application to the target 15 is also determined in synchronization with the circumferential position of the magnet 16 in the plane of rotation. That is, voltage application to the target 15 is stopped when the magnet 16 is located at the "opposed position" with respect to the gas introduction port 45 described above with reference to FIG. 3 and the sensor 53 is turned on (time t6, t7 in FIG. 4). It is noted that the discharge stop timing is not necessarily synchronized with the magnet position, but it is also possible to synchronize only the discharge start timing with the magnet position.

As described above, the circumferential uniformity of film thickness of the film formed on the substrate 10 can be improved by starting and ending voltage application to the target 15 when the center C1 of the magnet 16 is located at the "opposed position" with respect to the gas introduction port 45 across the rotation center C2. Consequently, the film thickness uniformity in the entire substrate surface can be improved, and a disc-shaped recording medium with high quality can be provided. For this, the following reasons are considered.

The variation of film thickness in the substrate surface arises from the variation of sputtering rate, and the sputtering rate depends on the plasma density distribution in the sputtering chamber. The plasma density depends on the pressure of the gas introduced into the sputtering chamber. As the gas pressure increases, the density of the generated plasma increases.

In this embodiment, in view of avoiding complicating the structure of the gas introduction system, the gas is introduced into the sputtering chamber 13 only from one location in its circumferential direction. Furthermore, because the mechanism for lifting the substrate 10 is located at the center bottom of the sputtering chamber 13, the exhaust port 37 is provided at the position eccentric with respect to the center of the sputtering chamber 13. This makes it difficult to uniformly distribute the gas in the sputtering chamber 13. The gas pressure tends to be maximized at the gas introduction port 45, decreased with the distance from the gas introduction port 45, and minimized near the aforementioned "opposed position", which is separated by 180° from the gas introduction port 45 in the circumferential direction of the sputtering chamber 13 and farthest from the gas introduction port 45.

Furthermore, the plasma having a density enough to effectively contribute to sputtering occurs substantially only below the magnet 16. Hence, the plasma density distribution in the sputtering chamber 13 depends on both the gas pressure distribution in the sputtering chamber 13 (i.e., the position of the gas introduction port 45 determining it) and the circumferential position of the magnet 16. Thus, in this embodiment, to improve the circumferential uniformity of film thickness on the substrate 10, the start/end timing of electrical discharge is determined on the basis of the position of the gas introduction port 45 and the circumferential position of the magnet 16.

Furthermore, in this embodiment, in view of improving the circumferential uniformity of film thickness, the magnet 16 is rotated an integer number of times. For instance, considering the case where the magnet 16 is rotated once, the rotation start position coincides with the rotation end position. The portion except this rotation start/end position, where the magnet 16 passes once, is opposed to the magnet 16 only once. However, the rotation start/end position is opposed to the magnet 16 double times (twice) as compared with the other positions.

For instance, in the case where the magnet 16 is located on the 180° opposite side of the aforementioned "opposed position" shown in FIG. 3, the (center C1 of the) magnet 16 is located nearest to the gas introduction port 45. Near the gas introduction port 45, the gas pressure is maximized. Hence, if voltage application to the target 15 is started when the magnet 16 is located at that gas introducing position, and voltage application to the target 15 is ended when the magnet 16 is located again at the start position after rotation of an integer number of times, then the magnet 16 is located near the gas introduction port 45 double times as compared with the other positions. Thus, the region of high plasma density is unevenly distributed near the gas introduction port 45. Consequently, on the film formation surface of the substrate 10, the film thickness of the portion opposed to the region near the gas introduction port 45 becomes thicker than the film thickness of the other portion.

In contrast, as described above with reference to FIG. 3, if voltage application to the target 15 is started and ended when the magnet 16 is located at the opposed position with respect to the gas introduction port 45 across its rotation center C2, then the region where high plasma density due to the magnet 16 is formed twice per one rotation becomes farthest from the gas introduction port 45, and the gas pressure is lower in that region farthest from the gas introduction port 45 than at and around the gas introduction port 45. As a result, decrease of plasma density in that region can be compensated. Consequently, this can improve the circumferential uniformity of the plasma density distribution in the sputtering chamber 13, and the circumferential uniformity of film thickness in the substrate surface.

Here, it may be contemplated to improve the film thickness distribution in the substrate surface by rotating the substrate 10 about its center in the horizontal plane. However, in the case of performing film formation on a substrate 10 which is a disc-shaped recording medium as in this embodiment, it is necessary to cover the center portion and the outer peripheral edge with masks 18, 19 so that the film is not attached to these portions. Hence, because the substrate 10 is subjected to sputtering film formation while being in contact with those masks 18, 19, rotating the substrate 10 requires addition of a mechanism for rotating also those masks 18, 19 in conjunction with the substrate 10. This complicates the apparatus configuration and incurs cost increase.

In contrast, in this embodiment, at the time of sputtering film formation, the substrate 10 is not rotated, hence eliminating the need of a mechanism for rotating the masks 18, 19. Furthermore, the gas introduction port 45 is provided only at one location. That is, in this embodiment, the apparatus body of the magnetron sputtering apparatus can be based on the existing structure, and the quality of film formation can be improved through a software-based approach in which the timing of starting/ending voltage application to the target 15 is controlled in synchronization with the circumferential position of the magnet 16 in the plane of rotation, without incurring significant alteration and cost increase.

It is noted that the timing of starting voltage application to the target 15 is not limited to when the center C1 and the rotation center C2 of the magnet 16 are aligned on a line in conjunction with the position of the gas introduction port 45 as shown in FIG. 3.

The region (region hatched with double-dot-dashed lines in FIG. 3) farther from the position of the gas introduction port 45 than the line (double-dot-dashed line) L2 passing through the rotation center C2 and being orthogonal in the plane of rotation of the magnet 16 to the line (dot-dashed line) L1 connecting between the position of the gas introduction port 45 and the rotation center C2 of the magnet 16, is a region where the gas pressure is relatively low in the sputtering chamber 13. Voltage application to the target 15 which is started when the center C1 of the magnet 16 is located on that region, results in compensating for the decrease of plasma density due to the low gas pressure, and is advantageous to uniformity of plasma density distribution in the sputtering chamber 13.

Furthermore, ending of voltage application to the target 15 is not limited to ending it when the center C1 of the magnet 16 is located at the same position as the position (start position) where the center C1 of the magnet 16 was located at the time of starting voltage application to the target 15. Voltage application to the target 15 may be ended at a position slightly past the start position (but within the range hatched with double-dot-dashed lines in FIG. 3), or a position slightly before the start position (again within the range hatched with double-dot-dashed lines in FIG. 3).

Furthermore, the aforementioned control of starting/ending electrical discharge in synchronization with the magnet position may be performed only at the time of starting voltage application to the target 15. For instance, voltage application to the target 15 may be ended when the center C1 of the magnet 16 is not located within the range hatched with double-dot-dashed lines in FIG. 3.

Furthermore, the installation position of the sensor 53 is not limited to the above embodiment. In the above description, it is determined that the magnet 16 is located at the aforementioned "opposed position" shown in FIG. 3 when the sensor 53 detects the to-be-detected object attached to the magnet 16 and turns on the sensor output. However, detection of the to-be-detected object by the sensor 53 is not limited to detection at that position. The to-be-detected object may be detected at another position, and the presence of the magnet 16 at the aforementioned "opposed position" may be recognized from calculation of time elapsed from the turn-on time of the sensor output on the basis of the circumferential distance between the aforementioned "opposed position" and the sensor attachment position as well as the number of revolutions of the magnet 16.

Furthermore, without providing a to-be-detected object on the magnet 16, it is also possible to determine the circumferential position of the magnet 16 in the plane of rotation by, for instance, monitoring the magnetic field strength of the magnet 16. Alternatively, it is also possible to determine the circumferential position of the magnet 16 in the plane of rotation on the basis of the driving signal of the motor 17.

Here, the inventors evaluated the circumferential distribution of film thickness by performing sputtering film formation on a substrate 10, with the circumferential position of the magnet 16 in the plane of rotation varied with respect to the position of the gas introduction port 45 (gas introducing position), and measuring the reflectance of the formed film in the circumferential direction.

Figure 6:
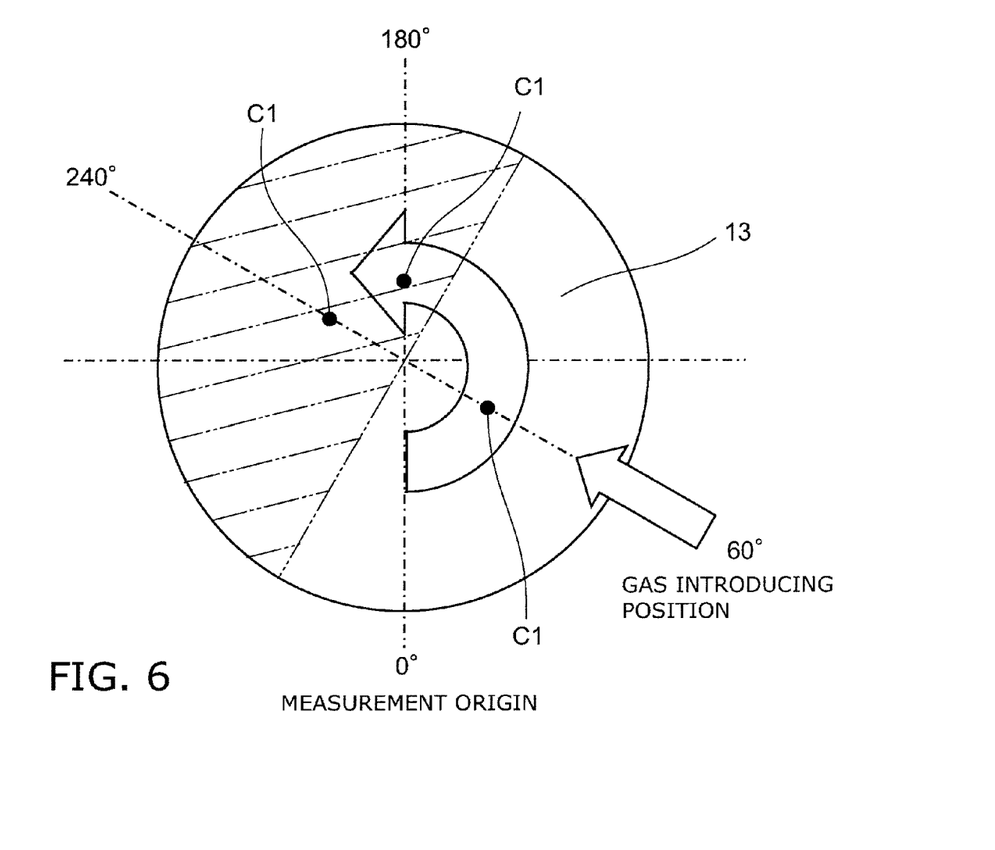
FIG. 6 is a schematic view showing the positions of the gas introducing position and the center of the magnet with respect to the measurement origin in the sputtering film formation experiment by the authors.

As shown in FIG. 6, with the measurement origin 0° set to one location in the circumferential direction (rotation direction of the magnet 16) of the sputtering chamber 13 having a generally circular shape in plan view, the gas was introduced into the sputtering chamber 13 from the position of 60° counterclockwise with respect to this measurement origin.

Evaluation was performed in three cases: the case of starting and ending voltage application to the target when the center C1 (corresponding to the center C1 in FIG. 3) of the magnet is located at the position of 60° (the same position as the gas introducing position) counterclockwise with respect to the measurement origin; the case of starting and ending voltage application to the target when the center C1 of the magnet is located at the position of 180° counterclockwise with respect to the measurement origin; and the case of starting and ending voltage application to the target when the center C1 of the magnet is located at the position of 240° (the same "opposed position" as in FIG. 3) counterclockwise with respect to the measurement origin.

Here, the "region farther from the position of the gas introduction port 45 than the line L1 passing through the rotation center C2 and being orthogonal in the plane of rotation of the magnet 16 to the line L2 connecting between the position of the gas introduction port 45 and the rotation center C2 of the magnet 16″, hatched with double-dot-dashed lines in FIG. 3, is again hatched with double-dot-dashed lines also in FIG. 6.

The target material was Ag, the number of revolutions of the magnet was 180 rpm, the power applied to the target was DC 1.6 kW, the gas was argon gas and introduced into the sputtering chamber at a flow rate of 20 sccm, the gas pressure in the sputtering chamber was maintained at 1.2 Pa, and the sputtering time was 1 second.

Figure 7:
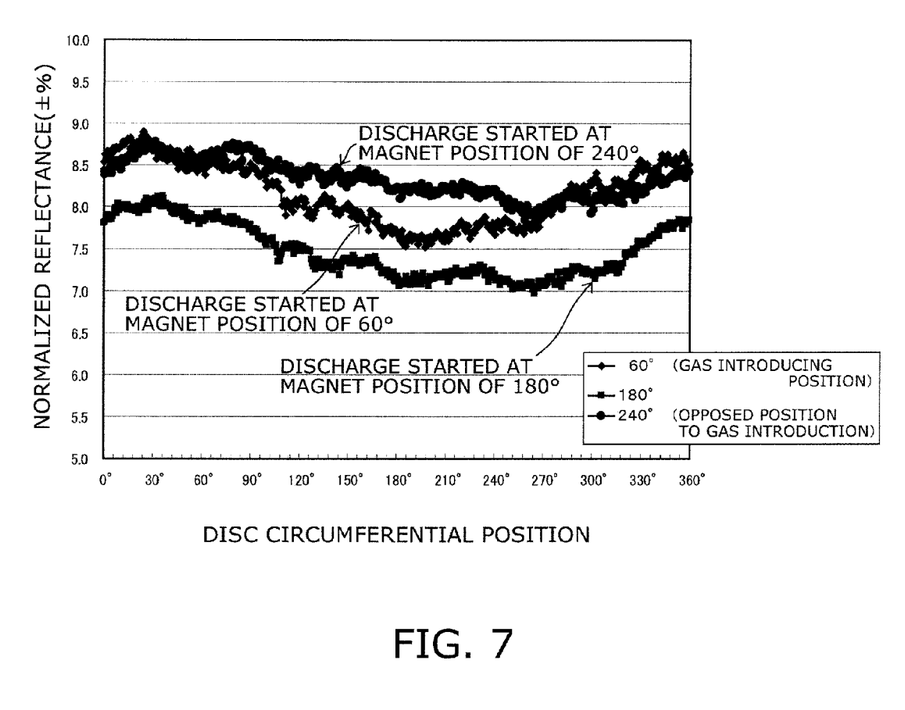
FIG. 7 is a schematic view showing the measurement result on the reflectance for one cycle in the circumferential direction at the position of radius 58 mm from the substrate center in the film formed on the substrate by performing the sputtering film formation experiment by the authors.

Measurement was performed on the reflectance for one cycle in the circumferential direction at the position of radius 58 mm from the substrate center. FIG. 7 shows a graph of this measurement result.

In this graph of FIG. 7, the horizontal axis represents the circumferential position for one cycle at the position of radius 58 mm from the substrate center. The vertical axis represents the reflectance (±%) normalized with reference to a reflectance of 30%.

The circumferential distribution of reflectance was determined on the basis of this measurement result in FIG. 7. This circumferential distribution was determined as the ratio of half the range (maximum−minimum) of reflectance data to the central value (which is herein half of maximum+minimum) of the data, that is, as (maximum−minimum)/(maximum+minimum)×100 [±%]. TABLE 1 shows this circumferential distribution. Here, the reflectance and film thickness of the formed film are proportionally related, and the circumferential distribution of reflectance represents the circumferential distribution of film thickness.

TABLE 1

| Discharge start position | Circumferential distribution [±%] |
|---|---|
| 60° | 1.81 |
| 180° | 1.54 |
| 240° | 1.22 |

From the result of TABLE 1, in the case where voltage application to the target (electrical discharge) is started when the magnet is located at the 240° position in FIG. 6, that is, when the magnet is located at the opposed position with respect to the gas introduction port, the circumferential distribution (variation) of reflectance (corresponding to film thickness) is minimized. On the contrary, in the case where voltage application to the target (electrical discharge) is started when the magnet is located at the same 60° position as the gas introduction port, the circumferential distribution is maximized, which means failure in uniform film formation in the circumferential direction. When the magnet is located at the 180° position, that is, within the aforementioned range hatched with double-dot-dashed lines, the circumferential distribution (variation) of reflectance (corresponding to film thickness) can be kept lower than that for the 60° position, which is the same as the gas introducing position, although it is larger than that for the aforementioned "opposed position".

What is claimed is:

1. A magnetron sputtering apparatus comprising:
a sputtering chamber in which a target can be opposed to an object to be subjected to film formation;
a gas introduction port facing the sputtering chamber;
a magnet provided outside the sputtering chamber and opposite to the target and being rotatable about a rotation center which is eccentric with respect to center of the magnet;
a sensor configured to detect a rotational position of the magnet in a plane of rotation of the magnet; and
a controller configured to control start timing of voltage application to the target to cause electrical discharge in the sputtering chamber on the basis of the rotational position of the rotating magnet with respect to a position of the gas introduction port,
wherein the controller starts the voltage application to the target when the center of the magnet is located on a region in the sputtering chamber in which a gas pressure is lower than at the gas introduction port.

2. The magnetron sputtering apparatus according to claim 1, wherein the controller ends the voltage application to the target when the center of the magnet is located at an identical position to time when the voltage application to the target is started.

3. A magnetron sputtering apparatus comprising:
a sputtering chamber in which a target can be opposed to an object to be subjected to film formation;
a gas introduction port facing the sputtering chamber;
a magnet provided outside the sputtering chamber and opposite to the target and being rotatable about a rotation center which is eccentric with respect to center of the magnet;
a sensor configured to detect a rotational position of the magnet in a plane of rotation of the magnet; and
a controller configured to control start timing of voltage application to the target to cause electrical discharge in the sputtering chamber on the basis of the rotational position of the rotating magnet with respect to a position of the gas introduction port,
wherein the controller starts the voltage application to the target when the center of the magnet is located on a region farther from a position of the gas introduction port than a line passing through the rotation center and being orthogonal in the plane of rotation of the magnet to a line connecting between the position of the gas introduction port and the rotation center of the magnet.

4. A magnetron sputtering apparatus comprising:
a sputtering chamber in which a target can be opposed to an object to be subjected to film formation;
a gas introduction port facing the sputtering chamber;
a magnet provided outside the sputtering chamber and opposite to the target and being rotatable about a rotation center which is eccentric with respect to center of the magnet;
a sensor configured to detect a rotational position of the magnet in a plane of rotation of the magnet; and
a controller configured to control start timing of voltage application to the target to cause electrical discharge in the sputtering chamber on the basis of the rotational position of the rotating magnet with respect to a position of the gas introduction port,
wherein the controller ends the voltage application to the target when the center of the magnet is located on a region farther from the position of the gas introduction port than a line passing through the rotation center and being orthogonal in the plane of rotation of the magnet to a line connecting between the position of the gas introduction port and the rotation center of the magnet.

5. A magnetron sputtering method comprising:
opposing a target to an object to be subjected to film formation in a sputtering chamber;
introducing a sputtering gas into the sputtering chamber from a gas introduction port facing the sputtering chamber, and rotating a magnet about a rotation center which is eccentric with respect to center of the magnet, the magnet being provided outside the sputtering chamber and opposite to the target; and starting voltage application to the target to cause electrical discharge in the sputtering chamber on the basis of a rotational position of the rotating magnet in a plane of rotation of the magnet with respect to a position of the gas introduction port, wherein the voltage application to the target is started when the center of the magnet is located on a region in the sputtering chamber in which a gas pressure is lower than at the gas introduction port.

6. The magnetron sputtering method according to claim 5, wherein the voltage application to the target is ended when the center of the magnet is located at an identical position to time when the voltage application to the target is started.

7. A magnetron sputtering method comprising:

opposing a target to an object to be subjected to film formation in a sputtering chamber;

introducing a sputtering gas into the sputtering chamber from a gas introduction port facing the sputtering chamber, and rotating a magnet about a rotation center which is eccentric with respect to center of the magnet, the magnet being provided outside the sputtering chamber and opposite to the target; and starting voltage application to the target to cause electrical discharge in the sputtering chamber on the basis of a rotational position of the rotating magnet in a plane of rotation of the magnet with respect to a position of the gas introduction port, wherein the voltage application to the target is started when the center of the magnet is located on a region farther from the position of the gas introduction port than a line passing through the rotation center and being orthogonal in the plane of rotation of the magnet to a line connecting between the position of the gas introduction port and the rotation center of the magnet.

8. A magnetron sputtering method comprising:

opposing a target to an object to be subjected to film formation in a sputtering chamber;

introducing a sputtering gas into the sputtering chamber from a gas introduction port facing the sputtering chamber, and rotating a magnet about a rotation center which is eccentric with respect to center of the magnet, the magnet being provided outside the sputtering chamber and opposite to the target; and starting voltage application to the target to cause electrical discharge in the sputtering chamber on the basis of a rotational position of the rotating magnet in a plane of rotation of the magnet with respect to a position of the gas introduction port, wherein the voltage application to the target is ended when the center of the magnet is located on a region farther from the position of the gas introduction port than a line passing through the rotation center and being orthogonal in the plane of rotation of the magnet to a line connecting between the position of the gas introduction port and the rotation center of the magnet.

* * * * *

UNITED STATES PATENT AND TRADEMARK OFFICE
CERTIFICATE OF CORRECTION

PATENT NO. : 8,663,432 B2  Page 1 of 1
APPLICATION NO. : 12/867354
DATED : March 4, 2014
INVENTOR(S) : Iwasaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 233 days.

Signed and Sealed this
Twenty-ninth Day of September, 2015

Michelle K. Lee
*Director of the United States Patent and Trademark Office*